(12) United States Patent
Cabuz et al.

(10) Patent No.: US 6,582,985 B2
(45) Date of Patent: Jun. 24, 2003

(54) SOI/GLASS PROCESS FOR FORMING THIN SILICON MICROMACHINED STRUCTURES

(75) Inventors: Cleopatra Cabuz, Edina, MN (US); Jeffrey Alan Ridley, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 5 days.

(21) Appl. No.: 09/748,488

(22) Filed: Dec. 27, 2000

(65) Prior Publication Data

US 2002/0081821 A1 Jun. 27, 2002

(51) Int. Cl.[7] ............................................. H01L 21/00
(52) U.S. Cl. ........................... 438/48; 438/50; 438/52; 438/456
(58) Field of Search .................. 438/50, 151, 456, 438/510, 48

(56) References Cited

U.S. PATENT DOCUMENTS

| | | | |
|---|---|---|---|
| 4,654,663 A | | 3/1987 | Alsenz et al. ............. 340/870.3 |
| 4,855,544 A | | 8/1989 | Glenn |
| 5,013,681 A | * | 5/1991 | Godbey et al. ............. 438/459 |
| 5,313,835 A | | 5/1994 | Dunn .......................... 73/505 |
| 5,329,815 A | | 7/1994 | Dunn et al. .................... 73/505 |
| 5,343,064 A | | 8/1994 | Spangler et al. |
| 5,490,420 A | | 2/1996 | Burdess .................... 73/504.02 |
| 5,492,596 A | | 2/1996 | Cho ......................... 156/632.1 |
| 5,542,558 A | * | 8/1996 | Benz et al. ..................... 216/2 |
| 5,646,348 A | | 7/1997 | Greiff et al. ............. 73/514.36 |
| 5,757,103 A | | 5/1998 | Lee et al. .................... 310/309 |
| 5,817,942 A | | 10/1998 | Greiff ....................... 73/514.01 |
| 5,866,469 A | * | 2/1999 | Hays ............................ 438/456 |
| 5,869,760 A | | 2/1999 | Geen ........................ 73/504.12 |
| 5,880,368 A | | 3/1999 | FritzPatrick ................. 73/493 |
| 5,894,090 A | | 4/1999 | Tang et al. ............... 73/504.02 |
| 5,914,801 A | | 6/1999 | Dhuler et al. ................ 359/230 |
| 5,969,250 A | | 10/1999 | Greiff ....................... 73/514.38 |
| 5,992,233 A | | 11/1999 | Clark ....................... 73/514.35 |
| 5,994,204 A | * | 11/1999 | Young et al. ................ 438/455 |

(List continued on next page.)

FOREIGN PATENT DOCUMENTS

WO   0078667   12/2000

OTHER PUBLICATIONS

U.S. patent application Ser. No.09/749,171, Cabuz et al., filed Dec. 27, 2000.

(List continued on next page.)

*Primary Examiner*—David Nelms
*Assistant Examiner*—Andy Huynh
(74) *Attorney, Agent, or Firm*—Kris T. Fredrick

(57) ABSTRACT

Methods for making thin silicon layers suspended over recesses in glass wafers. One method includes providing a thin silicon-on-insulator (SOI) wafer, and a glass wafer. The SOI wafer can include a silicon oxide layer disposed between a first undoped or substantially undoped silicon layer and a second silicon layer. Recesses can be formed in the glass wafer surface and electrodes may be formed on the glass wafer surface. The first silicon layer of the SOI wafer is then bonded to the glass wafer surface having the recesses, and the second silicon layer is subsequently removed using the silicon oxide layer as an etch stop. Next, the silicon oxide layer is removed. The first silicon layer can then be etched to form the desired structure. In another illustrative embodiment, the first silicon layer has a patterned metal layer thereon. The SOI wafer is bonded to the glass wafer, with the patterned metal layer positioned adjacent the recesses in the glass wafer. Then, the second silicon layer is removed using the silicon oxide layer as an etch stop, and the silicon oxide layer is subsequently removed. The first silicon layer is then etched using the patterned metal layer as an etch stop. The patterned metal layer is then removed.

35 Claims, 6 Drawing Sheets

U.S. PATENT DOCUMENTS

| | | | | |
|---|---|---|---|---|
| 6,067,858 | A | 5/2000 | Clark et al. | 73/504.16 |
| 6,087,747 | A | 7/2000 | Dhuler et al. | 310/90 |
| 6,089,088 | A | 7/2000 | Charvet | 73/504.12 |
| 6,089,089 | A | 7/2000 | Hsu | 73/504.12 |
| 6,092,417 | A | 7/2000 | Yamamoto | 73/504.04 |
| 6,125,700 | A | 10/2000 | Tsugai et al. | 73/504.12 |
| 6,190,571 | B1 | 2/2001 | Kato | 216/2 |
| 6,277,666 | B1 * | 8/2001 | Hays et al. | 438/50 |
| 6,372,609 | B1 * | 4/2002 | Aga et al. | 438/459 |
| 2001/0029072 | A1 * | 10/2001 | Kuwahara et al. | 438/151 |

OTHER PUBLICATIONS

J. Bernstein et al., "A Micromachined Comb–Drive Tuning Fork Rate Gyroscope," *Digest of IEEE/ASME MEMS Workshop*, pp. 143–148 (Feb. 1993).

W. A. Clark et al., "Surface Micromachined X–Axis Vibratory Rate Gyroscope," *Proceedings of Solid State Sensor and Actuator Workshop*, pp. 283–287 (Jun. 2–6, 1996).

Dave Van Domelen, "The Coriolis Effect," http://www.physics.ohio–state.edu/~dvandom/Edu/coriolis.html, pp. 1–3 (1996).

"Coriolis Effect," http://zebu.uoregon.edu/~js/glossary/coriolis_effect.html (dated on or before Dec. 27, 2000).

Thesis by William Clark, University of Berkeley, "Micro Machined Vibratory Rate Gyroscopes", 1997, pp. 14–21.

Y.B. Gianchandani et al., "A Bulk Silicon Dissolved Wafer Process for Microelectromechanical Devices", Journal of Microelectromechanical Systems, vol. 1, No. 2, Jun. 1992, pp. 77–85.

Mochida, Y., et al., "A micromachined vibrating rate gyroscope with independent beams for the drive and detection modes", Sensors and Actuators A, 80 (2000) pp. 170–178.

Puers, R., et al., "Design and processing experiments of a new miniaturized capacitive triaxial accelerometer", Sensors and Actuators A 68 (1998) pp. 324–328.

Xiao, Zhixiong, et al., "Silicon micro–accelerometer with mg resolution, high linearity and large frequency bandwidth fabricated with two mask bulk process", Sensors and Actuators 77 (1999), pp. 113–119.

* cited by examiner

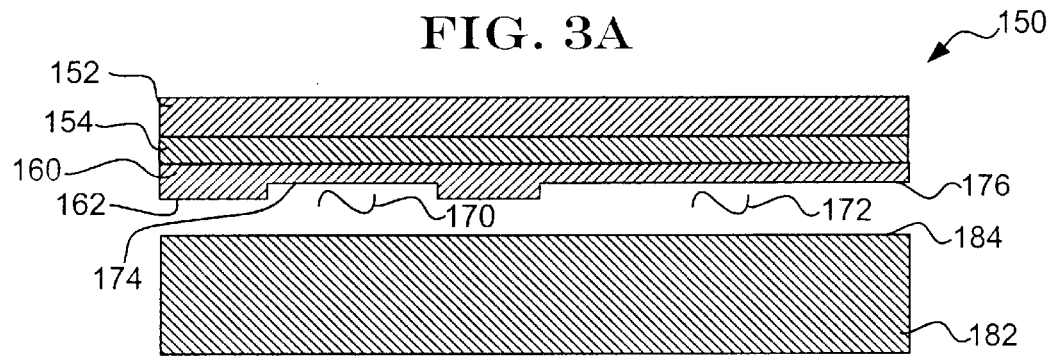
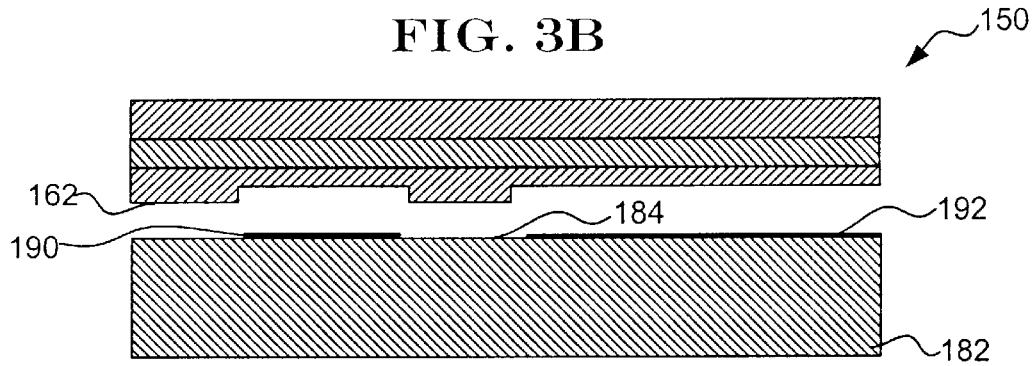
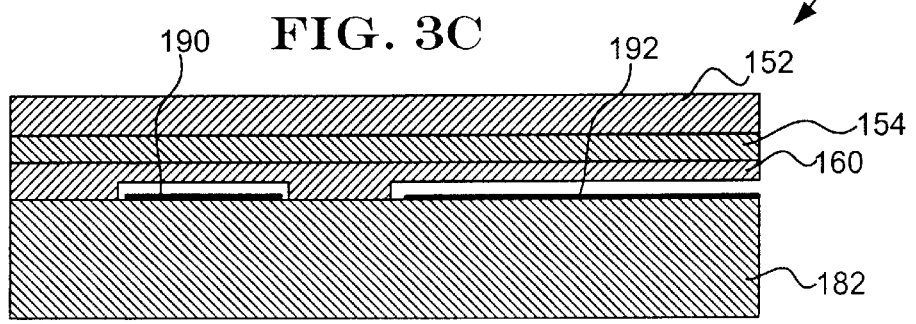

SOI/GLASS PROCESS FOR FORMING THIN SILICON MICROMACHINED STRUCTURES

CROSS-REFERENCE TO CO-PENDING PATENT APPLICATIONS

This application is related to co-pending U.S. patent application Ser. No. 09/749,171 [1100.1116101], entitled "THIN SILICON MICROMACHINED STRUCTURES", filed on date even herewith and incorporated herein by reference.

FIELD OF THE INVENTION

The present invention is related generally to semiconductor manufacturing and Micro Electro Mechanical Systems (MEMS). More specifically, the invention relates to methods for providing thin silicon micromachined structures.

BACKGROUND OF THE INVENTION

Micro Electro Mechanical Systems (MEMS) often utilize micromachined structures such as beams, slabs, combs, and fingers. These structures can exhibit curvature due to internal stresses and doping gradients. The curvature can be a significant source of error in inertial sensors such as accelerometers, tuning forks, and gyroscopes. Many desired structures have a flatness design criteria that is difficult or impossible to achieve using current processes. In particular, silicon layers heavily doped with boron can have a significant curvature when used in suspended structures.

The aforementioned structures are often made starting with a silicon wafer substrate. A boron-doped silicon epitaxial layer is then grown on the silicon wafer substrate and is subsequently patterned in the desired shape. As is further described below, the boron is used as an etch stop in later processing to allow for easy removal of the silicon substrate, leaving only the thin boron-doped epitaxial layer.

At the interface between the boron-doped epitaxial layer and the silicon substrate, the boron tends to diffuse out of the epitaxial layer and into the silicon substrate. This depletes the epitaxial layer of some boron, and enriches the silicon substrate with boron. The epitaxial layer thus often has a reduced concentration of boron near the interface, which is sometimes called the "boron tail."

After the boron-doped silicon epitaxial layer has been grown to the desired thickness, the silicon substrate is often removed using an etchant that is boron selective. Specifically, the etchant will etch away the silicon substrate, but not the boron-doped silicon epitaxial layer. One such etchant is a solution of ethylene diamine, pyrocatechol, and water (EDP). The etchant typically etches the silicon at a fast rate up to a certain high level boron concentration, at which point the etch rate significantly slows. This high boron concentration level is termed the etch stop level.

The boron concentration near the epitaxial layer surface having the boron tail may be lower than the etch stop level, allowing the etching to remove some of the epitaxial layer surface at a reasonable rate, stopping at the etch stop level of boron concentration beneath the initial surface. The resulting boron-doped structure, such as a beam, thus has two surfaces, the silicon side surface that has the boron tail and the airside surface that has a boron surface layer concentration substantially equal to the concentration in the bulk of the beam away from either surface. Thus, the opposing surfaces have different boron surface layer concentrations.

The building of a suspended element often includes using an epitaxially grown single-crystal silicon heavily doped with boron, for example, greater than ten to the twentieth atoms per cubic centimeter ($10^{20}/cm^3$). In some applications, this doped material may present problems. One problem is an intrinsic tensile stress, which, when the boron-doped layer is relatively thick, can produce severe wafer bow. This wafer bow is incompatible with some fabrication steps. Another problem is that the thickness of the epitaxial layer may be limited due to technological reasons, for example, deposition conditions. Yet another problem is that the Young modulus of the boron-doped material may be lower than that of silicon, and may not be well known and understood.

In addition, the intrinsic losses of the boron-doped material may be higher than those of low-doped silicon. In the lost wafer process, the final release of the mechanical structure is often performed using a long, wet-etching step, which can be based on ethylene-diamine-pyrocathacol (EDP) solution, which requires careful control to maintain industrial hygiene standards during manufacture. What would be desirable is a fabrication process that eliminates the need for highly doped silicon and does not require a wet-etching step using EDP.

SUMMARY OF THE INVENTION

The present invention includes methods for making thin silicon cantilevered or suspended structures which can be used to make Micro Electro Mechanical Systems (MEMS). The thin, silicon suspended structure can be used in a number of applications including, for example, accelerometers, gyroscopes, inertial sensing devices and so on. One illustrative embodiment of the present invention begins with a glass wafer and a silicon-on-insulator (SOI) wafer. The SOI wafer includes an insulator layer such as an oxide layer disposed between a first silicon layer and a second silicon layer. The insulator layer may be, for example, a silicon oxide layer.

In one illustrative embodiment, one or more recesses are formed in the glass wafer surface using standard photolithography and etching techniques. After formation of the recesses, electrodes may be formed at least partially within the recesses and, in some embodiments, on the surface of the glass wafer itself, if desired. The electrodes within the recesses may serve as, for example, one plate of a capacitor for sensing distance to, or vibration of, a later added suspended structure disposed over the recess.

The SOI wafer is bonded to the glass wafer, over the recessed and non-recessed portions, using an appropriate method such as anodic bonding, adhesives, heat bonding or any other suitable means. After bonding, the silicon layer of the SOI wafer that is located away from the glass wafer may be removed, using the insulator layer as an etch stop. The insulator layer can then be removed, leaving a single thin silicon layer. A photolithography and etching step can be used to pattern the remaining silicon layer in order to define the desired structure. Preferably, a DRIE process or other suitable process is used to pattern the remaining silicon layer. Suitable structures include tuning forks, combs, and cantilevered structures, among others.

In another illustrative embodiment of the present invention, a glass wafer or substrate, and an SOI wafer with a metal layer on one surface thereof are provided. Like above, and in one illustrative embodiment, the glass wafer may be etched to form a recess or recesses in the glass wafer surface, and electrodes may be formed on the glass wafer surface and/or in the recesses. At least a portion of the metal layer on the SOI wafer is preferably patterned to coincide with the recesses in the glass wafer. The SOI wafer may then be bonded to the glass wafer surface, with the metal layer toward the glass wafer. After bonding, the silicon layer of the SOI wafer that is located away from the glass wafer may be removed, using the insulator layer as an etch stop. The insulator layer is then removed, leaving a single thin silicon layer bonded to the glass wafer.

A photolithographic and DRIE or other suitable process may then be used to etch the remaining silicon layer into a desired pattern, preferably in the region above the patterned metal layer. The etchant is preferably selected to etch through the remaining silicon layer but not through the underlying metal layer. The metal layer thus may act as an etch stop. The metal layer is believed to allow for sharper feature definition at the silicon-metalization layer interface, and also provides a barrier during the silicon etch step that may prevent gases in the recesses from escaping into the atmosphere, such as into a DRIE chamber. After etching of the remaining silicon layer, the metal layer may be removed using standard etching techniques.

BRIEF DESCRIPTION OF THE DRAWINGS

FIGS. 3A–3C are highly diagrammatic, longitudinal, cross-sectional views similar to that shown in FIGS. 1A–1D above, but with the recess or recesses formed in the silicon wafer rather than the glass wafer.

DETAILED DESCRIPTION OF THE INVENTION

Figure 1A:
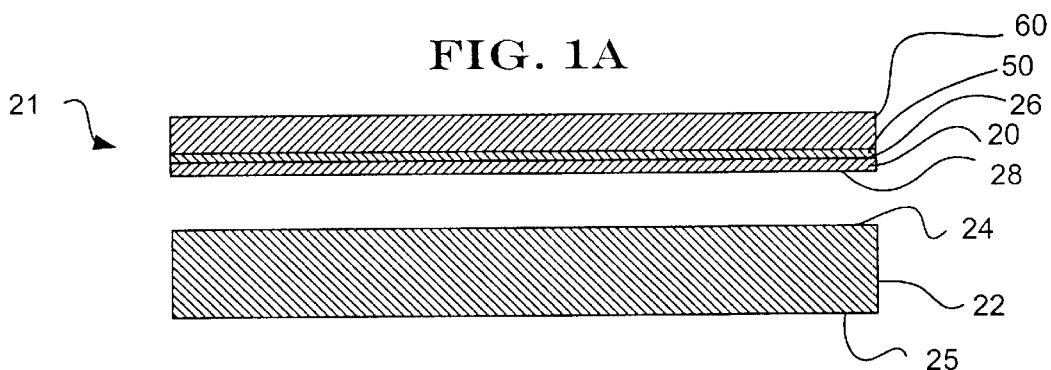
FIG. 1A is a highly diagrammatic, longitudinal, cross-sectional view of a glass wafer and a silicon-on-insulator wafer having a silicon oxide layer disposed between first and second silicon layers.

FIG. 1A illustrates a silicon-on-insulator (SOI) wafer 21 having a first silicon wafer or layer 20, an insulator wafer or layer 50, and a second silicon wafer or layer 60. First silicon layer 20 has a first surface 28, and a second substantially co-planar surface 26 abutting insulator layer 50. In one embodiment, insulator layer 50 is an oxide layer, such as silicon oxide. The first silicon layer 20 is preferably undoped or substantially undoped (such as less than $10^{18}/cm^3$, and more preferably less than about $10^{17}/cm^3$, and has a thickness of about between 5 and 200 microns or more preferably between about 10 and 100 microns, depending on the application. A glass wafer or substrate 22 is also provided, preferably formed from a material such as a Pyrex™ Corning Type No. 7740. The glass wafer 22 has a first surface 24 and substantially co-planar second surface 25.

Figure 1B:
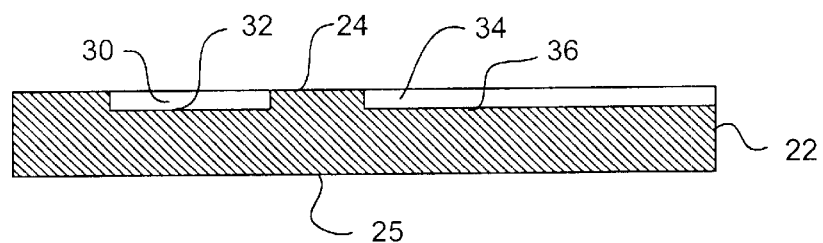
FIG. 1B is a highly diagrammatic, longitudinal, cross-sectional view of the glass wafer of FIG. 1A after recess formation.

To form an accelerometer, tuning fork, or gyroscope or the like, recesses may be formed in the top surface 24 of the glass wafer. In FIG. 1B, a first recess 30 and a second recess 34 are etched into the top surface 24 of the glass wafer 22. The first recess has a first recessed surface 32 and the second recess 34 has a second recessed surface 36. In some embodiments of the present invention, the recesses are used to form a capacitive gap for the detection of displacement of inertial electrodes, and are formed using standard etching techniques well known to those skilled in the art.

Figure 1C:
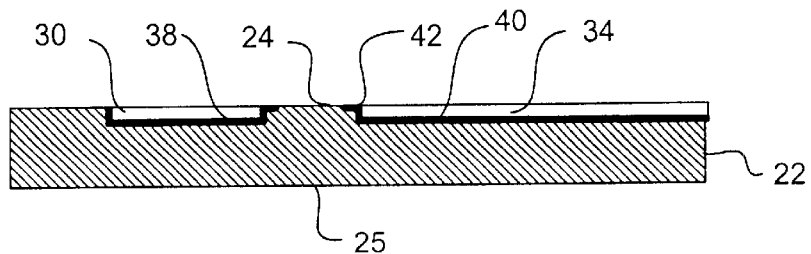
FIG. 1C is a highly diagrammatic, longitudinal, cross-sectional view of the glass wafer of FIG. 1B, after electrode formation.

FIG. 1C illustrates glass wafer 22 after electrodes 38 and 40 have been formed on the first recessed surface 32 and the second recessed surface 36. Although electrodes 38 and 40 are shown covering substantially all of the recesses surfaces 32 and 36, it is contemplated that only a portion of the recessed surfaces 32 and 36 may be covered, if desired. In addition, the second recess 34 has an electrode tab or ear 42 extending nearer the unrecessed surface of the glass wafer 22. This may or may not be required, depending on the application. Metal electrodes 38 and 40 are preferably formed using techniques well known to those skilled in the art. In one illustrative embodiment, the electrodes are titanium-platinum or gold-based electrodes.

Figure 1D:
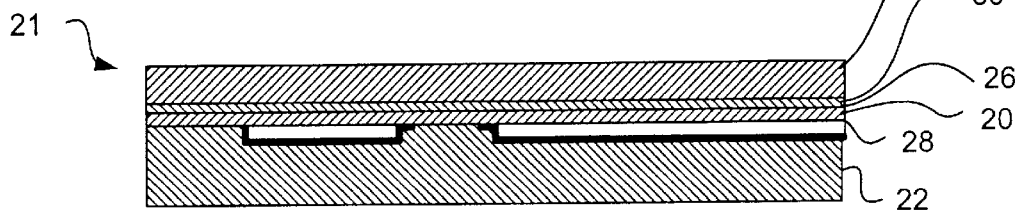
FIG. 1D is a highly diagrammatic, longitudinal, cross-sectional view of the silicon-on-insulator wafer of FIG. 1A bonded to the glass wafer of FIG. 1B.

FIG. 1D illustrates SOI wafer 21 and glass wafer 22 after the first surface 28 of the first silicon layer 20 of SOI wafer 21 has been bonded to glass wafer 22. As may be seen from inspection of FIG. 1D, SOI wafer 21 has been bonded over both recessed and nonrecessed portions of glass wafer 22. In one embodiment, SOI wafer 21 is bonded using an anodic bonding process. However, other bonding techniques may be used including adhesives, heat bonding, etc.

Figure 1E:
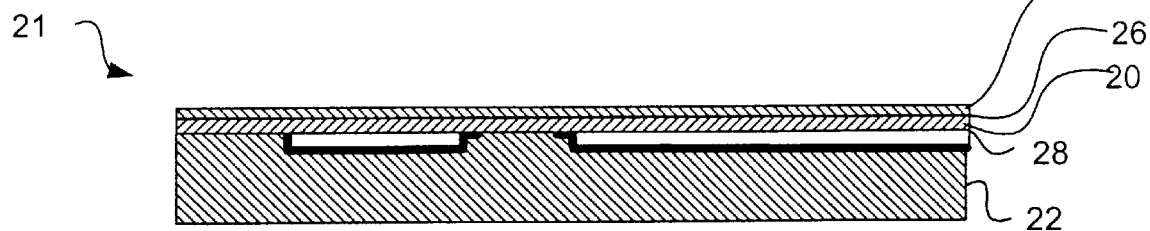
FIG. 1E is a highly diagrammatic, longitudinal, cross-sectional view of the silicon-on-insulator wafer and glass wafer of FIG. 1D after removal of the second silicon layer.
Figure 1F:
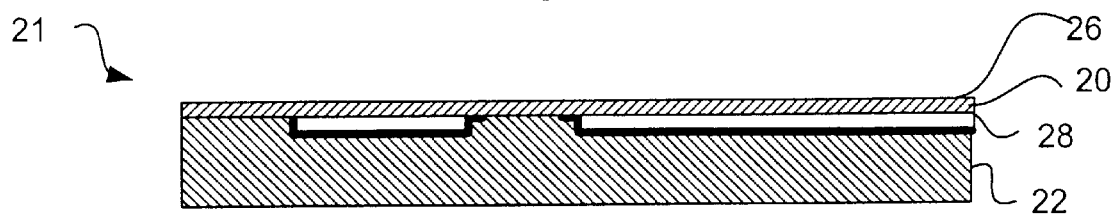
FIG. 1F is a highly diagrammatic, longitudinal, cross-sectional view of the silicon-on-insulator wafer and glass wafer of FIG. 1D after removal of the silicon oxide layer.

FIG. 1E illustrates the removal of the second silicon layer 60 from SOI wafer 21. In one embodiment, second silicon layer 60 is removed through etching. In a preferred embodiment, silicon layer 60 is thinned down by grinding or KOH etching, followed by final etching using a Reactive Ion Etch (RIE) down to oxide layer 50. Next, the oxide layer may be removed. FIG. 1F shows the structure after the oxide layer 50 has been removed, preferably using a Buffered Oxide Etch Solution (BOE) etching process.

Figure 1G:
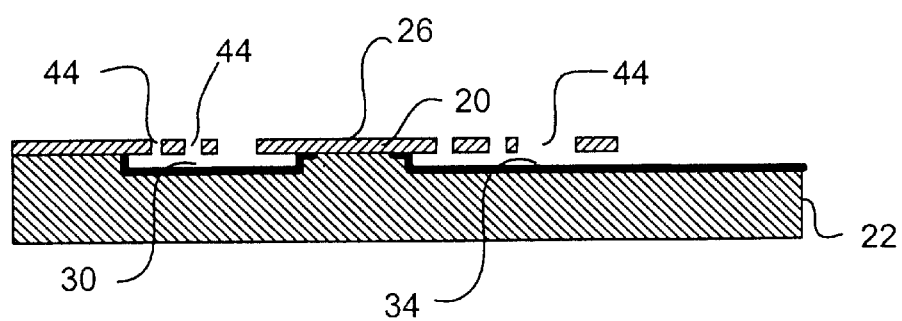
FIG. 1G is a highly diagrammatic, longitudinal, cross-sectional view of the silicon-on-insulator wafer and glass wafer of FIG. 1F after selective etching through the first silicon layer.

FIG. 1G illustrates the first silicon layer 20 of SOI wafer 21 after an etch has been performed on second surface 26 of first silicon layer 20. When forming a typical device, such as an accelerometer, tuning fork, or gyroscope, several etched regions 44 may be formed. Preferably, the silicon etch extends through the first silicon layer 20 and into recesses 30 and 34 of the glass wafer 22. The silicon is preferably etched using standard silicon etching procedures, such as a Deep Reactive Ion Etch (DRIE) process. Preferably, a standard photolithography process is used to define the desired structural shapes in the silicon wafer 20. Examples of suitable shapes include, but are not limited to, cantilevered beams, suspended beams, combs, tuning forks, plates, etc.

Figure 2A:
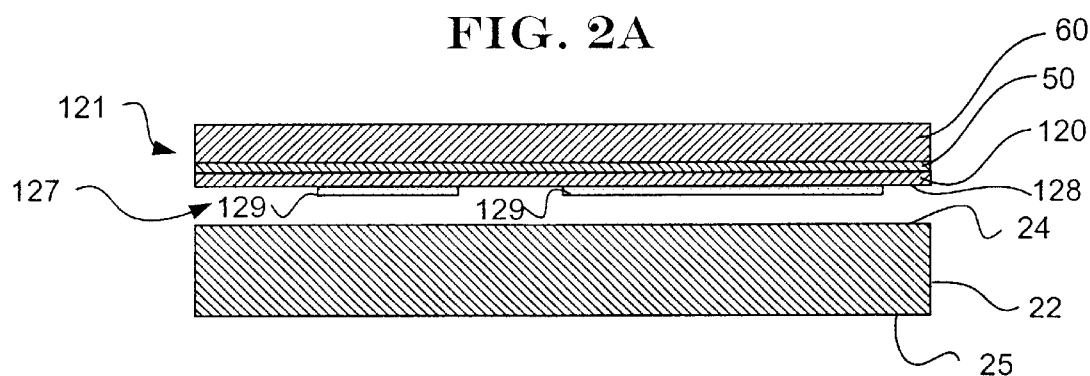
FIG. 2A is a highly diagrammatic, longitudinal, cross-sectional view of a glass wafer and a silicon-on-insulator wafer having a silicon oxide layer disposed between first and second silicon layers, where the first silicon layer surface is partially coated with a metal layer.

In another illustrative embodiment, and referring now to FIG. 2A, a SOI wafer 121 is provided. Like above, the SOI wafer 121 has a first silicon layer 120, an oxide layer 50, and a second silicon layer 60. A metal layer 129 is then provided on a first surface of the first silicon layer 120 of the SOI wafer. The metal layer 129 may be provided as part of the originally supplied SOI wafer 121, or may be deposited or otherwise formed thereupon using conventional methods. One suitable metal for the formation of metal layer 129 is chromium on oxide, although other metals or alloys may be used.

Figure 2B:
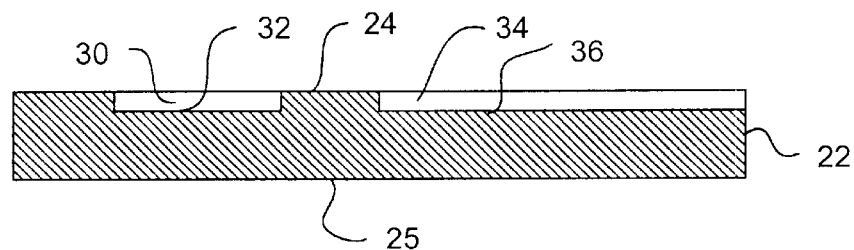
FIG. 2B is a highly diagrammatic, longitudinal, cross-sectional view of the glass wafer of FIG. 2A after recess formation.
Figure 2C:
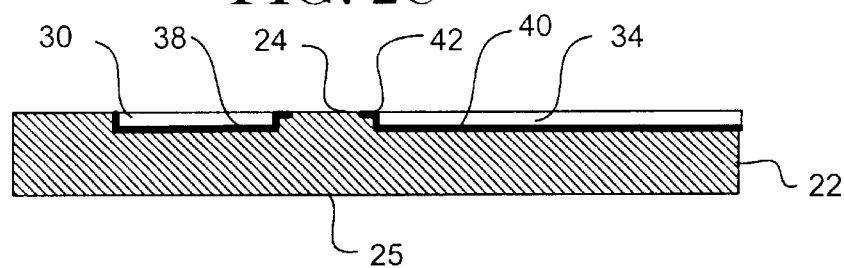
FIG. 2C is a highly diagrammatic, longitudinal, cross-sectional view of the glass wafer of FIG. 2B after electrode formation.

FIG. 2B illustrates a glass wafer 22 after recesses 30 and 34 have been formed, as previously discussed above with respect to FIG. 1B above. FIG. 2C illustrates glass wafer 22 after formation of electrodes 38 and 40, as previously discussed with respect to FIG. 1C. Preferably, the metal layer 129 is patterned so that the remaining metal corresponds to or is otherwise defined to fit within recesses 30 and 34.

Figure 2D:
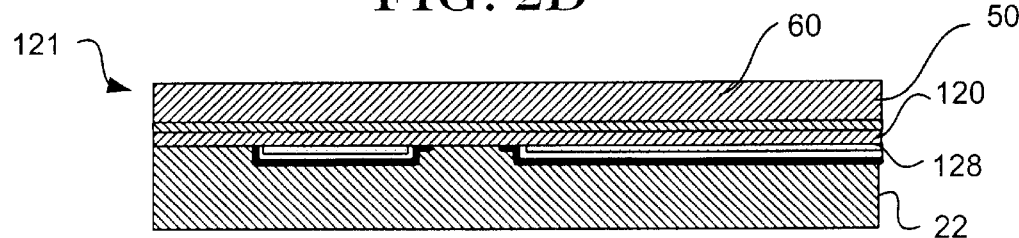
FIG. 2D is a highly diagrammatic, longitudinal, cross-sectional view of the silicon-on-insulator wafer of FIG. 2A bonded to the glass wafer of FIG. 2B.

In FIG. 2D, the metalized SOI wafer 121 is shown bonded to the glass wafer 22, with the metal layer 129 situated adjacent the glass wafer 22. One method for bonding the SOI wafer 121 to the glass wafer 22 is anodic bonding. A by-product of some anodic bonding processes is the release of oxygen. As can be seen, the cavities formed between the recesses 30 and 34 and the SOI wafer 121 may collect the oxygen released during the anodic bonding process, and thus may have an increased concentration thereof.

Figure 2E:
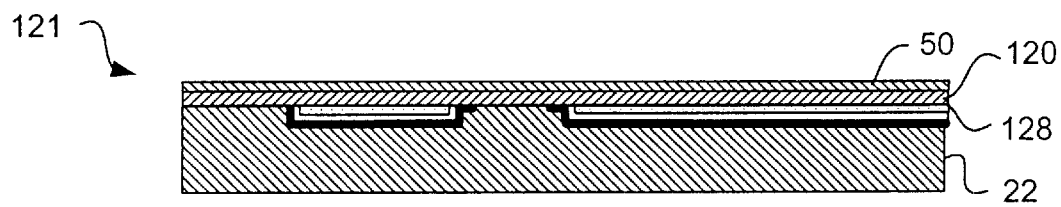
FIG. 2E is a highly diagrammatic, longitudinal, cross-sectional view of the silicon-on-insulator wafer and glass wafer of FIG. 2D after removal of the second silicon layer.
Figure 2F:
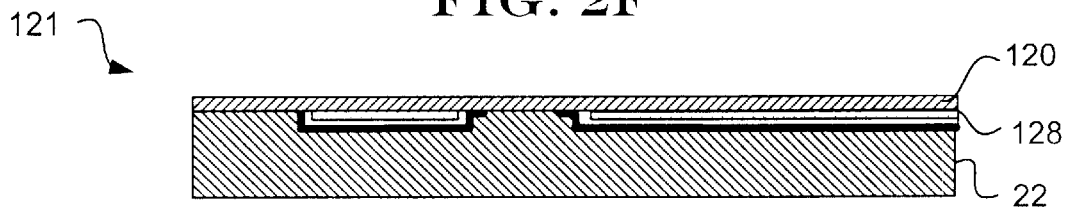
FIG. 2F is a highly diagrammatic, longitudinal, cross-sectional view of the silicon-on-insulator wafer and glass wafer of FIG. 2E after removal of the silicon oxide layer.

FIG. 2E shows the structure after the second silicon layer 60 of the SOI wafer 121 is removed. In a preferred embodiment, silicon layer 60 is thinned by grinding or KOH etching, followed by a final etch down to the oxide layer 50 using a Reactive Ion Etch (RIE). FIG. 2F illustrates the structure after the oxide layer 50 of the SOI wafer 121 has been removed. In one embodiment, oxide layer 50 is removed through stripping in a BOE etching process.

Figure 2G:
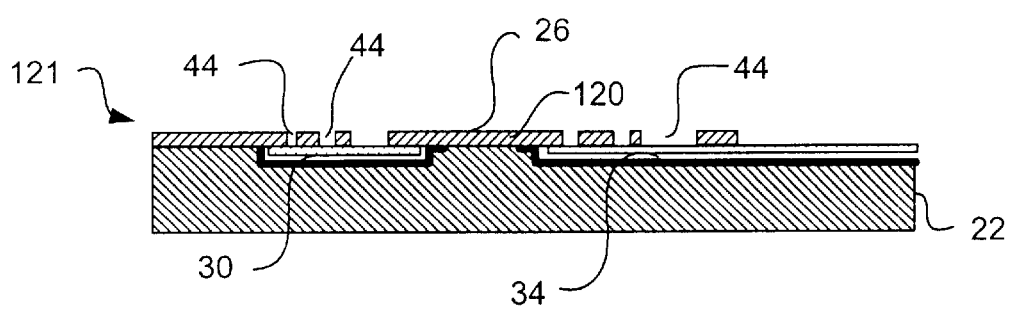
FIG. 2G is a highly diagrammatic, longitudinal, cross-sectional view of the silicon-on-insulator wafer and glass wafer of FIG. 2F after selective etching through the first silicon layer.

FIG. 2G shows the remaining first silicon layer 120 after a pattern has been etched therein to form the desired structure. The etching preferably includes a suitably selective etchant that etches through the first silicon layer 120, but not through metal layer 129. Standard lithography techniques can be used to form the series of recesses, channels, or holes 144 through the silicon wafer 120, but not through the metal layer 129. The metal layer 129 thus may serve as an etch stop layer. It has been found that by providing an etch stop layer, sharper feature definition at the interface of the silicon wafer 120 and the metal layer 129 can be achieved, resulting in more precise feature definition in the resulting silicon structure.

Another benefit of providing metal layer 129 is that a seal or barrier is provided to prevent gasses from escaping from recesses 30 and 34 into the atmosphere during the silicon etching process. This can be particularly important when the remaining silicon layer 120 is etched using an etching process that relies at least in part on the gas composition in the surrounding atmosphere, such as a DRIE etching process. The release of gases, such as oxygen which as described above may be collected in the recesses 30 and 34 during the anodic bonding process, can effect the effectiveness and/or controllability of some etching processes, such as a DRIE etching process.

Figure 2H:
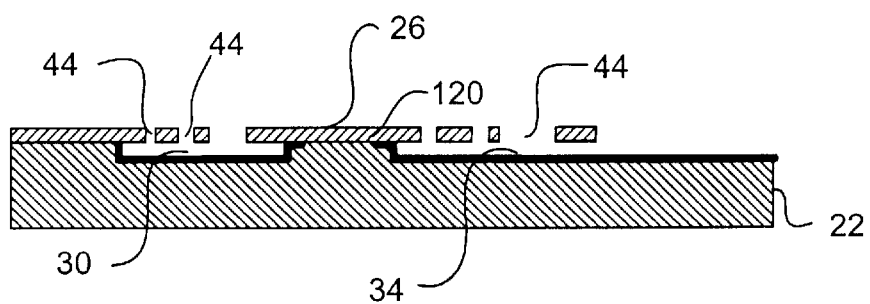
FIG. 2H is a highly diagrammatic, longitudinal, cross-sectional view of the silicon-on-insulator wafer and glass wafer of FIG. 2G after removal of the metal layer.

FIG. 2H illustrates the remaining silicon layer 120 and glass wafer 22 after the metal layer 129 has been removed. The metal layer 129 may be removed in recess areas 30 and 34 using techniques well known to those skilled in the art. In one example, an etchant capable of removing the metal layer 129, but not the silicon wafer 120, may be applied to the silicon wafer recesses 144. The etchant may thus dissolve metal layer 129. In a preferred embodiment, the etchant is capable of removing metal layer 129, but does not remove electrodes 38 and 40.

FIGS. 3A–3C are highly diagrammatic, longitudinal, cross-sectional views similar to that shown in FIGS. 1A–1D above, but with the recess or recesses formed in the silicon wafer 150 rather than the glass wafer 182. FIG. 3A illustrates a silicon-on-insulator (SOI) wafer 150 having a first silicon wafer or layer 160, an insulator wafer or layer 154, and a second silicon wafer or layer 152. First silicon layer 160 has a first surface 162. A first recess 170 and a second recess 172 are etched into the first surface 162 of the first silicon wafer or layer 160, as shown. Preferably, the first recess 170 and the second recess 172 do not extend all the way through the first silicon wafer or layer 160. The first recess 170 has a first recessed surface 174 and the second recess 172 has a second recessed surface 176. In some embodiments, the recesses are used to form a capacitive gap for the detection of displacement of inertial electrodes, and are formed using standard etching techniques well known to those skilled in the art. A glass wafer or substrate 182 is also provided, preferably formed from a material such as a Pyrex™ Corning Type No. 7740. The glass wafer 182 has a first surface 184.

FIG. 3B illustrates the glass wafer 182 after electrodes 190 and 192 have been formed on the first surface 184 of the glass wafer 182. FIG. 3C also illustrates SOI wafer 150 and glass wafer 182 after the first surface 162 of the first silicon layer 160 of SOI wafer 150 has been bonded to the first surface 184 of glass wafer 182. In one embodiment, SOI wafer 150 is bonded using an anodic bonding process. However, other bonding techniques may be used including adhesives, heat bonding, etc. The remaining processing steps may be similar to that shown and described above with respect to FIGS. 1E–1G.

Figure 4A:
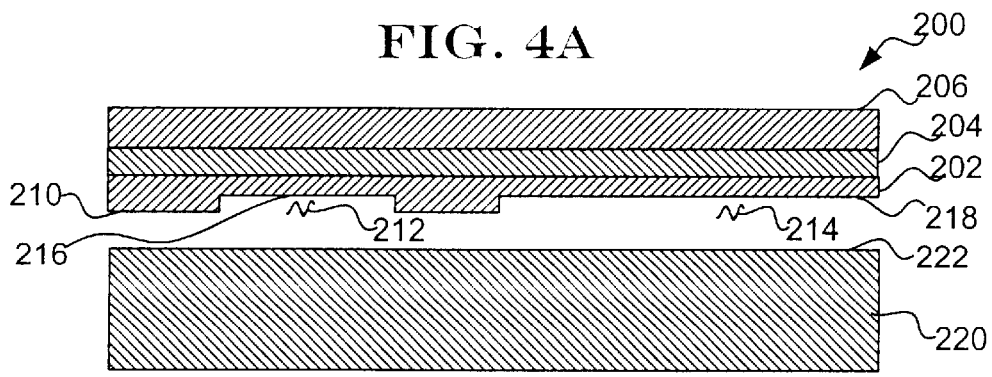
FIGS. 4A–4C are highly diagrammatic, longitudinal, cross-sectional views similar to that shown in FIGS. 2A–2D above, but with the recess or recesses formed in the silicon wafer rather than the glass wafer.
Figure 4B:
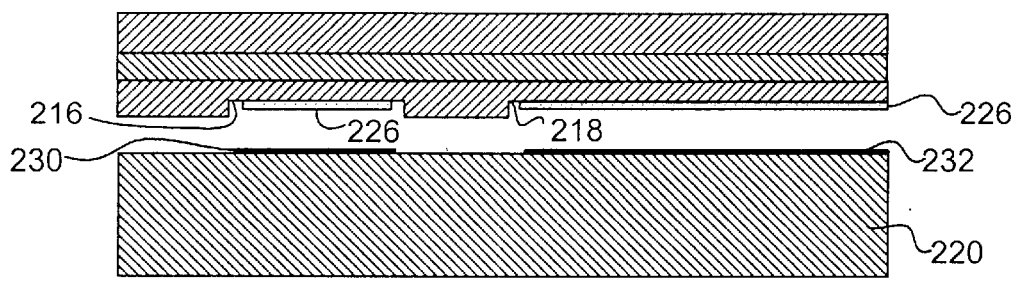
Figure 4C:
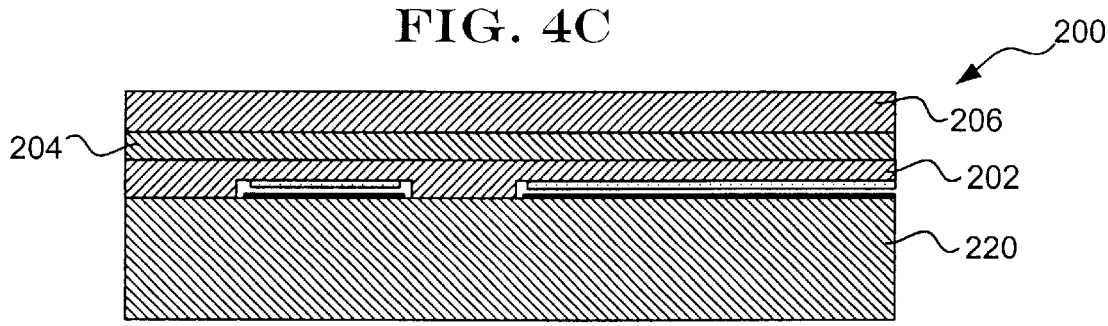

FIGS. 4A–4C are highly diagrammatic, longitudinal, cross-sectional views similar to that shown in FIGS. 2A–2D above, but with the recess or recesses formed in the silicon wafer rather than the glass wafer. Like in FIG. 2A, an SOI wafer 200 has a first silicon layer 202, an oxide layer 204, and a second silicon layer 206. First silicon layer 202 has a first surface 210. A first recess 212 and a second recess 214 are etched or otherwise formed into the first surface 210 of the first silicon wafer or layer 202, as shown. Preferably, the first recess 212 and the second recess 214 do not extend all the way through the first silicon wafer or layer 202. The first recess 212 has a first recessed surface 216 and the second recess 214 has a second recessed surface 218. A glass wafer or substrate 220 is also provided, preferably formed from a material such as a Pyrex™ Corning Type No. 7740. The glass wafer 220 has a first surface 222.

As shown in FIG. 4B, a metal layer 226 is provided on the first recessed surface 216 and the second recessed surface 218 of the SOI wafer 200. The metal layer is preferably deposited or otherwise formed thereupon using conventional methods. One suitable metal for the formation of metal layer 226 is chromium on oxide, although other metals or alloys may be used. FIG. 4B also illustrates the glass wafer 220 after electrodes 230 and 232 have been formed.

FIG. 4C shows SOI wafer 200 and glass wafer 220 after the first surface 210 of the first silicon layer 202 of SOI wafer 200 has been bonded to the glass wafer 220. In one embodiment, SOI wafer 200 is bonded using an anodic bonding process. However, other bonding techniques may be used including adhesives, heat bonding, etc. The remaining processing steps may be similar to that shown and described above with respect to FIGS. 2E–2H.

While the above illustrative embodiments use an SOI wafer and a glass wafer, it is contemplated that any other suitable material systems may be used. For example, rather than using a silicon-on-insulator (SOI) wafer having a first silicon wafer or layer, an insulator wafer or layer, and a second silicon wafer or layer, it is contemplated that any layered structure having a first layer, an etch stop layer and a second layer may be used. Likewise, rather than using a glass wafer, any fairly rigid substrate may be used.

Numerous advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. For example, while the above illustrative embodiments include a silicon-on-insulator wafer bonded to a glass wafer or substrate, other material systems may be used. The invention's scope is, of course, defined in the language in which the appended claims are expressed.

What is claimed is:

1. A method for making a thin silicon suspended structure comprising the steps of:
    providing a glass wafer or substrate having a surface;
    providing an SOI wafer having an insulating layer disposed between a first silicon layer and a second silicon layer;
    forming a recess in said glass wafer surface;
    bonding said SOI wafer to said glass wafer surface such that at least part of said first silicon layer is bonded to said glass wafer surface so that at least part of said first silicon layer overhangs said recess;
    removing said second silicon layer of the SOI wafer;
    removing the insulating layer of the SOI wafer; and
    selectively patterning the first silicon layer of the SOI wafer after removing the insulating layer to form a thin silicon suspended structure that at least partially overhangs said recess.

2. The method for making the thin silicon suspended structure as in claim 1, further comprising forming at least one electrode on said glass wafer surface that is in alignment with at least part of said recess.

3. The method for making the thin silicon suspended structure as in claim 1, wherein said electrode forming step includes forming a titanium-platinum electrode.

4. The method for making the thin silicon suspended structure as in claim 1, wherein said electrode forming step includes forming a gold electrode.

5. The method for making the thin silicon suspended structure as in claim 1, wherein said bonding step includes anodic bonding.

6. The method for making the thin silicon suspended structure as in claim 1, wherein said removing the second silicon layer step includes grinding.

7. The method for making the thin silicon suspended structure as in claim 6, wherein said removing the second silicon layer step further includes reactive ion etching.

8. The method for making the thin silicon suspended structure as in claim 1, wherein said removing the second silicon layer step includes KOH etching.

9. The method for making the thin silicon suspended structure as in claim 8, wherein said removing the second silicon layer step further includes reactive ion etching.

10. The method for making the thin silicon suspended structure as in claim 1, wherein said removing the second silicon layer step includes dry etching.

11. The method for making the thin silicon suspended structure as in claim 1, wherein said removing the insulating layer step includes BOE etching.

12. The method for making the thin silicon suspended structure as in claim 1, wherein said selectively removing said first silicon layer step includes etching.

13. The method for making the thin silicon suspended structure as in claim 12, wherein said selectively removing said first silicon layer step includes DRIE etching.

14. The method for making the thin silicon suspended structure as in claim 12, wherein said selectively removing said first silicon layer step includes reactive ion etching.

15. The method for making the thin silicon suspended structure as in claim 1, wherein said selectively removing said first silicon layer step includes photolithography and deep reactive ion etching (DRIE).

16. A method for making a thin silicon suspended structure comprising the steps of:
    providing a glass wafer or substrate having a surface;
    providing a SOI wafer having an insulating layer disposed between a first silicon layer and a second silicon layer;
    forming a recess in said glass wafer surface or the first silicon layer of the SOI wafer;
    providing a patterned metal layer adjacent the first silicon layer, the patterned metal layer coinciding with at least part of said recess;
    bonding said SOI wafer to said glass wafer surface such that at least part of said first silicon layer is bonded to said glass wafer surface so that at least part of said first silicon layer is bonded to said glass wafer surface so that at least part of said first silicon layer overhangs said recess;
    removing said second silicon layer;
    removing said insulating layer;
    selectively patterning the first silicon layer to form a thin silicon suspended structure that at least partially overhangs said recess; and
    removing said metal layer.

17. The method for making the thin silicon suspended structure as in claim 16, further comprising forming at least one electrode on said glass wafer that aligns with at least part of said recess.

18. The method for making the thin silicon suspended structure as in claim 16, wherein said bonding step includes anodic bonding.

19. The method for making the thin silicon suspended structure as in claim 16, wherein said removing the second silicon layer step includes grinding.

20. The method for making the thin silicon suspended structure as in claim 19, wherein said removing the second silicon layer step further includes reactive ion etching.

21. The method for making the thin silicon suspended structure as in claim 16, wherein said removing the second silicon layer step includes KOH etching.

22. The method for making the thin silicon suspended structure as in claim 21, wherein said removing the second silicon layer step further includes reactive ion etching.

23. The method for making the thin silicon suspended structure as in claim 16, wherein said removing the second silicon layer step includes dry etching.

24. The method for making the thin silicon suspended structure as in claim 16, wherein said removing the insulating layer step includes BOE etching.

25. The method for making the thin silicon suspended structure as in claim 16, wherein said selectively patterning said first silicon layer step includes etching.

26. The method for making the thin silicon suspended structure as in claim 25, wherein said selectively removing said first silicon layer step includes plasma etching.

27. The method for making the thin silicon suspended structure as in claim 25, wherein said selectively removing said first silicon layer step includes reactive ion etching.

28. The method for making the thin silicon suspended structure as in claim 25, wherein said selectively removing said first silicon layer step includes deep reactive ion etching.

29. A method for making a thin suspended structure comprising the steps of:

providing a first wafer or substrate having a surface;

providing a second wafer having an etch stop layer disposed between a first layer and a second layer;

forming a recess in said first wafer surface;

bonding said second wafer to said first wafer surface such that at least part of said first layer of said second wafer is bonded to said first wafer surface so that at least part of said first layer overhangs said recess;

removing said second layer of the second wafer;

removing the etch stop layer of the second wafer; and selectively patterning the first layer of the second wafer after removing the etch stop layer to form a thin suspended structure that at least partially overhangs said recess.

30. A method for making a thin silicon suspended structure comprising the steps of:

providing a glass wafer or substrate having a surface;

providing an SOI wafer having an insulating layer disposed between a first silicon layer and a second silicon layer;

forming a recess at most partially through said first silicon layer of said SOI wafer;

bonding said SOI wafer to said glass wafer surface such that at least part of said first silicon layer is bonded to said glass wafer surface so that at least part of said first silicon layer overhangs said recess;

removing said second silicon layer of the SOI wafer;

removing the insulating layer of the SOI wafer; and selectively patterning the first silicon layer of the SOI wafer to form a thin silicon suspended structure that at least partially overhangs said recess.

31. The method of claim 30 wherein the step of selectively patterning the first silicon layer of the SOI wafer to form a thin silicon suspended structure that at least partially overhangs said recess is performed after the step of removing the insulating layer of the SOI wafer.

32. The method of claim 30 further comprising the steps of:

providing a metal layer on said first silicon layer of the SOI wafer in the recess prior to the bonding step; and removing the metal layer after the first silicon layer of the SOI wafer is selectively patterned.

33. A method for making a thin silicon suspended structure comprising the steps of:

providing a first wafer or substrate having a surface;

providing a second wafer having an etch stop layer disposed between a first layer and a second layer;

forming a recess at most partially into said first layer of said second wafer;

bonding said second wafer to said surface of said first wafer such that at least part of said first layer of said second wafer is bonded to said surface so that at least part of said first layer overhangs said recess;

removing said second layer of the second wafer;

removing the etch stop layer of the second wafer; and selectively patterning the first layer of the second wafer to form a thin suspended structure that at least partially overhangs said recess.

34. The method of claim 33 wherein the step of selectively patterning the first layer of the second wafer to form a thin suspended structure that at least partially overhands said recess is performed after the step of removing the etch stop layer of the second wafer.

35. The method of claim 33 further comprising the steps of:

providing a metal layer on said first layer of the second wafer in the recess prior to the bonding step; and removing the metal layer after the first layer of the second wafer is selectively patterned.

* * * * *